(12) United States Patent
Dellock et al.

(10) Patent No.: US 10,720,551 B1
(45) Date of Patent: Jul. 21, 2020

(54) VEHICLE LAMPS

(71) Applicant: Ford Global Technologies, LLC, Dearborn, MI (US)

(72) Inventors: Paul Kenneth Dellock, Northville, MI (US); Harry Lobo, Canton, MI (US); Stuart C. Salter, White Lake, MI (US); David Brian Glickman, Southfield, MI (US); Talat Karmo, Waterford, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/238,860

(22) Filed: Jan. 3, 2019

(51) Int. Cl.
*H01L 33/26* (2010.01)
*H01L 33/50* (2010.01)
*B60Q 1/30* (2006.01)

(52) U.S. Cl.
CPC ............. *H01L 33/26* (2013.01); *B60Q 1/30* (2013.01); *H01L 33/502* (2013.01)

(58) Field of Classification Search
CPC .......... H01L 33/26; H01L 33/502; B60Q 1/30
See application file for complete search history.

(56) References Cited

U.S. PATENT DOCUMENTS

| | | | |
|---|---|---|---|
| 2,486,859 A | 11/1949 | Meijer et al. |
| 5,053,930 A | 10/1991 | Benavides |
| 5,434,013 A | 7/1995 | Fernandez |
| 5,709,453 A | 1/1998 | Krent et al. |
| 5,839,718 A | 11/1998 | Hase et al. |
| 6,031,511 A | 2/2000 | DeLuca et al. |
| 6,114,954 A | 9/2000 | Palett et al. |
| 6,117,362 A | 9/2000 | Yen et al. |
| 6,260,988 B1 | 7/2001 | Misawa et al. |
| 6,294,990 B1 | 9/2001 | Knoll et al. |
| 6,419,854 B1 | 7/2002 | Yocom et al. |
| 6,494,490 B1 | 12/2002 | Trantoul |
| 6,577,073 B2 | 6/2003 | Shimizu et al. |
| 6,729,738 B2 | 5/2004 | Fuwausa et al. |
| 6,737,964 B2 | 5/2004 | Samman et al. |
| 6,773,129 B2 | 8/2004 | Anderson, Jr. et al. |
| 6,820,888 B1 | 11/2004 | Griffin |
| 6,851,840 B2 | 2/2005 | Ramamurthy et al. |
| 6,859,148 B2 | 2/2005 | Miller |
| 6,871,986 B2 | 3/2005 | Yamanaka et al. |
| 6,953,536 B2 | 10/2005 | Yen et al. |
| 6,990,922 B2 | 1/2006 | Ichikawa et al. |

(Continued)

FOREIGN PATENT DOCUMENTS

| CN | 101337492 A | 1/2009 |
|---|---|---|
| CN | 201169230 Y | 2/2009 |

(Continued)

*Primary Examiner* — Sitaramarao S Yechuri
(74) *Attorney, Agent, or Firm* — David Coppiellie; Price Heneveld LLP (57) ABSTRACT

A vehicle lamp includes a substrate. A first conductor is positioned on the substrate. A dielectric layer is coupled to the first conductor. A semiconductor layer is configured to emit a first light. A second conductor is coupled to the semiconductor layer. A polymeric layer comprising a photoluminescent element coupled to the second conductor. The photoluminescent element is configured to emit a second light in response to receiving the first light.

20 Claims, 3 Drawing Sheets

(56) References Cited

U.S. PATENT DOCUMENTS

| | | | |
|---|---|---|---|
| 7,015,893 B2 | 3/2006 | Li et al. |
| 7,161,472 B2 | 1/2007 | Strumolo et al. |
| 7,213,923 B2 | 5/2007 | Liu et al. |
| 7,216,997 B2 | 5/2007 | Anderson, Jr. |
| 7,249,869 B2 | 7/2007 | Takahaski et al. |
| 7,264,366 B2 | 9/2007 | Hulse |
| 7,264,367 B2 | 9/2007 | Hulse |
| 7,347,576 B2 | 3/2008 | Wang et al. |
| 7,354,182 B2 | 4/2008 | Bartels |
| 7,441,914 B2 | 10/2008 | Palmer et al. |
| 7,458,698 B2 | 12/2008 | Heathcock et al. |
| 7,501,749 B2 | 3/2009 | Takeda et al. |
| 7,575,349 B2 | 8/2009 | Bucher et al. |
| 7,589,622 B2 | 9/2009 | Farley |
| 7,635,212 B2 | 12/2009 | Seidler |
| 7,726,856 B2 | 6/2010 | Tsutsumi |
| 7,745,818 B2 | 6/2010 | Sofue et al. |
| 7,753,541 B2 | 7/2010 | Chen et al. |
| 7,826,948 B2 | 11/2010 | Messih et al. |
| 7,834,548 B2 | 11/2010 | Jousse et al. |
| 7,862,220 B2 | 1/2011 | Cannon et al. |
| 7,876,205 B2 | 1/2011 | Catten et al. |
| 7,987,030 B2 | 7/2011 | Flores et al. |
| 8,016,465 B2 | 9/2011 | Egerer et al. |
| 8,022,818 B2 | 9/2011 | la Tendresse et al. |
| 8,044,415 B2 | 10/2011 | Messere et al. |
| 8,066,416 B2 | 11/2011 | Bucher |
| 8,071,988 B2 | 12/2011 | Lee et al. |
| 8,097,843 B2 | 1/2012 | Agrawal et al. |
| 8,103,414 B2 | 1/2012 | Boss et al. |
| 8,118,441 B2 | 2/2012 | Hessling |
| 8,120,236 B2 | 2/2012 | Auday et al. |
| 8,136,425 B2 | 3/2012 | Bostick |
| 8,163,201 B2 | 4/2012 | Agrawal et al. |
| 8,169,131 B2 | 5/2012 | Murazaki et al. |
| 8,178,852 B2 | 5/2012 | Kingsley et al. |
| 8,197,105 B2 | 6/2012 | Yang |
| 8,203,260 B2 | 6/2012 | Li et al. |
| 8,207,511 B2 | 6/2012 | Bortz et al. |
| 8,232,533 B2 | 7/2012 | Kinglsey et al. |
| 8,247,761 B1 | 8/2012 | Agrawal et al. |
| 8,261,686 B2 | 9/2012 | Birman et al. |
| 8,286,378 B2 | 10/2012 | Martin et al. |
| 8,317,329 B2 | 11/2012 | Seder et al. |
| 8,317,359 B2 | 11/2012 | Harbers et al. |
| 8,408,765 B2 | 4/2013 | Kuhlman et al. |
| 8,408,766 B2 | 4/2013 | Wilson et al. |
| 8,414,168 B2 | 4/2013 | Jutila et al. |
| 8,415,642 B2 | 4/2013 | Kingsley et al. |
| 8,421,811 B2 | 4/2013 | Odland et al. |
| 8,459,832 B2 | 6/2013 | Kim |
| 8,466,438 B2 | 6/2013 | Lambert et al. |
| 8,519,359 B2 | 8/2013 | Kingsley et al. |
| 8,519,362 B2 | 8/2013 | Labrot et al. |
| 8,539,702 B2 | 9/2013 | Li et al. |
| 8,552,848 B2 | 10/2013 | Rao et al. |
| 8,606,430 B2 | 12/2013 | Seder et al. |
| 8,624,716 B2 | 1/2014 | Englander |
| 8,631,598 B2 | 1/2014 | Li et al. |
| 8,653,553 B2 | 2/2014 | Yamazaki et al. |
| 8,664,624 B2 | 3/2014 | Kingsley et al. |
| 8,683,722 B1 | 4/2014 | Cowan |
| 8,724,054 B2 | 5/2014 | Jones |
| 8,754,426 B2 | 6/2014 | Marx et al. |
| 8,773,012 B2 | 7/2014 | Ryu et al. |
| 8,846,184 B2 | 9/2014 | Agrawal et al. |
| 8,851,694 B2 | 10/2014 | Harada |
| 8,876,352 B2 | 11/2014 | Robbins et al. |
| 8,905,610 B2 | 12/2014 | Coleman et al. |
| 8,922,388 B2 | 12/2014 | Nykerk |
| 8,937,454 B2 | 1/2015 | Baarman et al. |
| 8,952,341 B2 | 2/2015 | Kingsley et al. |
| 8,963,705 B2 | 2/2015 | Miller et al. |
| 8,985,414 B2 | 3/2015 | Aftanas |
| 8,994,495 B2 | 3/2015 | Dassanayake et al. |
| 9,006,751 B2 | 4/2015 | Kleo et al. |
| 9,018,833 B2 | 4/2015 | Lowenthan et al. |
| 9,057,021 B2 | 6/2015 | Kingsley et al. |
| 9,059,378 B2 | 6/2015 | Verger et al. |
| 9,065,447 B2 | 6/2015 | Buttolo et al. |
| 9,067,530 B2 | 6/2015 | Bayersdorfer et al. |
| 9,150,061 B2 | 10/2015 | Riehle et al. |
| 9,187,034 B2 | 11/2015 | Tarahomoi et al. |
| 9,194,168 B1 | 11/2015 | Lu et al. |
| 9,290,123 B2 | 3/2016 | Salter et al. |
| 9,299,887 B2 | 3/2016 | Lowenthal et al. |
| 9,315,148 B2 | 4/2016 | Schwenke et al. |
| 9,442,888 B2 | 9/2016 | Stanfield et al. |
| 9,452,709 B2 | 9/2016 | Aburto Crespo |
| 9,568,659 B2 | 2/2017 | Verger et al. |
| 9,579,987 B2 | 2/2017 | Penilla et al. |
| 9,616,812 B2 | 4/2017 | Sawayanagi |
| 2002/0159741 A1 | 10/2002 | Graves et al. |
| 2002/0163792 A1 | 11/2002 | Formoso |
| 2003/0167668 A1 | 9/2003 | Fuks et al. |
| 2003/0179548 A1 | 9/2003 | Becker et al. |
| 2004/0213088 A1 | 10/2004 | Fuwausa |
| 2005/0028596 A1 | 2/2005 | Gall |
| 2005/0084229 A1 | 4/2005 | Babbitt et al. |
| 2005/0189795 A1 | 9/2005 | Roessler |
| 2006/0087826 A1 | 4/2006 | Anderson, Jr. |
| 2006/0097121 A1 | 5/2006 | Fugate |
| 2007/0030136 A1 | 2/2007 | Teshima et al. |
| 2007/0032319 A1 | 2/2007 | Tufte |
| 2007/0285938 A1 | 12/2007 | Palmer et al. |
| 2007/0297045 A1 | 12/2007 | Sakai et al. |
| 2008/0205075 A1 | 8/2008 | Hikmet et al. |
| 2009/0217970 A1 | 9/2009 | Zimmerman et al. |
| 2009/0219730 A1 | 9/2009 | Syfert et al. |
| 2009/0251920 A1 | 10/2009 | Kino et al. |
| 2009/0260562 A1 | 10/2009 | Folstad et al. |
| 2009/0262515 A1 | 10/2009 | Lee et al. |
| 2010/0102736 A1 | 4/2010 | Hessling |
| 2011/0012062 A1 | 1/2011 | Agrawal et al. |
| 2011/0171762 A1* | 7/2011 | West .................. G01L 33/44 438/27 |
| 2011/0253198 A1* | 10/2011 | Patrick ................ B82Y 20/00 136/247 |
| 2011/0260188 A1* | 10/2011 | Choi .................... G01L 33/46 257/98 |
| 2011/0265360 A1 | 11/2011 | Podd et al. |
| 2012/0001406 A1 | 1/2012 | Paxton et al. |
| 2012/0020101 A1 | 1/2012 | Pastrick et al. |
| 2012/0104954 A1 | 5/2012 | Huang |
| 2012/0138997 A1* | 6/2012 | Tasaki ................ G02B 5/0808 257/98 |
| 2012/0183677 A1 | 7/2012 | Agrawal et al. |
| 2012/0187824 A1* | 7/2012 | Yamakawa ........ C09K 11/665 313/503 |
| 2012/0280528 A1 | 11/2012 | Dellock et al. |
| 2012/0305918 A1* | 12/2012 | Shum ............... H01L 21/02381 257/49 |
| 2013/0009855 A1 | 1/2013 | Gally et al. |
| 2013/0050979 A1 | 2/2013 | Van De Ven et al. |
| 2013/0092965 A1 | 4/2013 | Kijima et al. |
| 2013/0093311 A1* | 4/2013 | Hardinger ............. C09D 11/50 313/483 |
| 2013/0154821 A1 | 6/2013 | Miller et al. |
| 2013/0335994 A1 | 12/2013 | Mulder et al. |
| 2014/0003044 A1 | 1/2014 | Harbers et al. |
| 2014/0029281 A1 | 1/2014 | Suckling et al. |
| 2014/0065442 A1 | 3/2014 | Kingsley et al. |
| 2014/0103258 A1 | 4/2014 | Agrawal et al. |
| 2014/0199800 A1* | 7/2014 | Vockic ................. H01L 31/055 438/65 |
| 2014/0211498 A1 | 7/2014 | Cannon et al. |
| 2014/0264396 A1 | 9/2014 | Lowenthal et al. |
| 2014/0266666 A1 | 9/2014 | Habibi |
| 2014/0288832 A1 | 9/2014 | Hoch et al. |
| 2014/0373898 A1 | 12/2014 | Rogers et al. |
| 2015/0046027 A1 | 2/2015 | Sura et al. |
| 2015/0085488 A1 | 3/2015 | Grote, III et al. |
| 2015/0109602 A1 | 4/2015 | Martin et al. |

(56) References Cited

U.S. PATENT DOCUMENTS

| | | |
|---|---|---|
| 2015/0138789 A1 | 5/2015 | Singer et al. |
| 2015/0267881 A1 | 9/2015 | Salter et al. |
| 2015/0280059 A1* | 10/2015 | Kang .................. H01L 33/06 257/13 |
| 2015/0307033 A1 | 10/2015 | Preisler et al. |
| 2015/0324708 A1 | 11/2015 | Skipp et al. |
| 2015/0339928 A1 | 11/2015 | Ramanujam |
| 2015/0346727 A1 | 12/2015 | Ramanujam |
| 2015/0366036 A1 | 12/2015 | Luostarinen |
| 2016/0016506 A1 | 1/2016 | Collins et al. |
| 2016/0082880 A1 | 3/2016 | Co et al. |
| 2016/0102819 A1 | 4/2016 | Misawa et al. |
| 2016/0131327 A1 | 5/2016 | Moon et al. |
| 2016/0214535 A1 | 7/2016 | Penilla et al. |
| 2016/0236613 A1 | 8/2016 | Trier |
| 2016/0240794 A1 | 8/2016 | Yamada et al. |
| 2017/0158125 A1 | 6/2017 | Schuett et al. |
| 2017/0213165 A1 | 7/2017 | Stauffer et al. |
| 2017/0253179 A1 | 9/2017 | Kumada |
| 2018/0023771 A1* | 1/2018 | Kim .................. F21K 9/90 362/84 |
| 2018/0239245 A1* | 8/2018 | Yang .................. G03F 7/0044 |
| 2019/0279825 A1* | 9/2019 | van Hest .......... H01L 51/0024 |

FOREIGN PATENT DOCUMENTS

| | | |
|---|---|---|
| CN | 201193011 Y | 2/2009 |
| CN | 202357840 U | 8/2012 |
| CN | 204127823 U | 1/2015 |
| CN | 104869728 A | 8/2015 |
| CN | 105303642 A | 2/2016 |
| DE | 4120677 A1 | 1/1992 |
| DE | 29708699 U1 | 7/1997 |
| DE | 10319396 A1 | 11/2004 |
| DE | 102004031224 A1 | 1/2006 |
| DE | 102006002973 A1 | 8/2007 |
| DE | 102011118431 A1 | 5/2013 |
| EP | 0812729 A2 | 12/1997 |
| EP | 1793261 A1 | 6/2007 |
| EP | 2719580 A1 | 4/2014 |
| EP | 2778209 A1 | 9/2014 |
| JP | 2000052859 A | 2/2000 |
| JP | 2000159011 A | 6/2000 |
| JP | 2007238063 A | 9/2007 |
| KR | 20060026531 A | 3/2006 |
| WO | 2006047306 A1 | 5/2006 |
| WO | 2008093266 A1 | 8/2008 |
| WO | 2014068440 A1 | 5/2014 |
| WO | 2014161927 A1 | 10/2014 |

* cited by examiner

VEHICLE LAMPS

FIELD OF THE INVENTION

The present disclosure generally relates to vehicle lamps, and more particularly to semiconductor vehicle lamps.

BACKGROUND OF THE INVENTION

Automotive regulations, depending on jurisdiction, may only allow certain colors of lights to be utilized on vehicles. Perovskite based semiconductor light sources often only can emit certain colors of light which may not conform to local automotive regulations. Accordingly, new lighting designs which utilize perovskite based semiconductor light sources, but which conform to local automotive regulations may be advantageous.

SUMMARY OF THE INVENTION

According to at least one example of the present disclosure, a vehicle lamp includes a substrate. A first conductor is positioned on the substrate. A dielectric layer is coupled to the first conductor. A semiconductor layer is configured to emit a first light. A second conductor is coupled to the semiconductor layer. A polymeric layer comprising a photoluminescent element coupled to the second conductor. The photoluminescent element is configured to emit a second light in response to receiving the first light.

According to another example of the present disclosure, a vehicle tail lamp includes a first metallic conductor positioned on a substrate. A semiconductor layer is coupled to the first conductor and comprises a plurality of perovskites configured to emit a first light. A second conductor is coupled to the semiconductor layer. The second conductor comprises a substantially transparent material. A photoluminescent element is coupled to the second conductor and configured to emit a second light in response to receiving the first light.

According to yet another example of the present disclosure, a vehicle lamp includes a semiconductor layer comprising a plurality of perovskites coupled between a first conductor and a second conductor. The plurality of perovskites is configured to emit a first light of a wavelength range of from about 495 nm to about 570 nm in response to an electrical potential being generated between the first and second conductors. A photoluminescent element is positioned to receive the first light and emit a second light of a wavelength of a range of from about 600 nm to about 750 nm in response to receiving the first light.

These and other aspects, objects, and features of the present disclosure will be understood and appreciated by those skilled in the art upon studying the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

DETAILED DESCRIPTION OF THE PREFERRED EMBODIMENTS

Additional features and advantages of the invention will be set forth in the detailed description which follows and will be apparent to those skilled in the art from the description, or recognized by practicing the invention as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

Figure 1A:
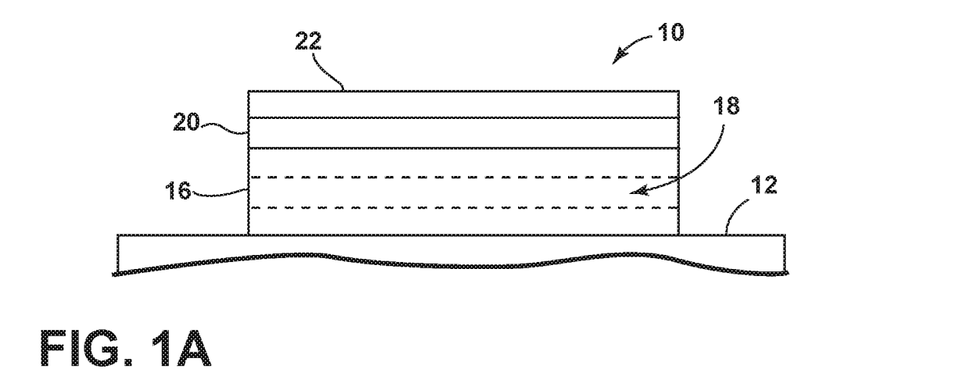
FIG. 1A is a side view of a photoluminescent structure rendered as a coating according to at least one example.
Figure 1B:
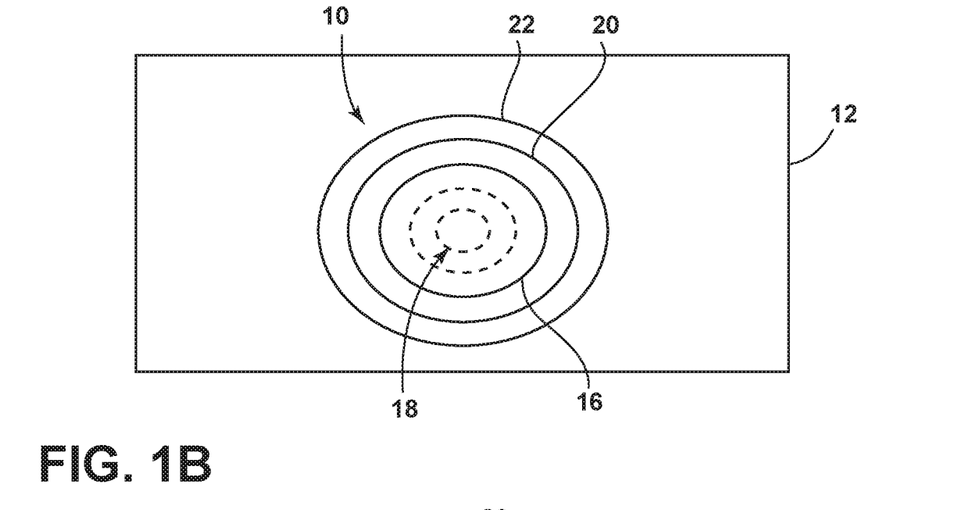
FIG. 1B is a top view of a photoluminescent structure rendered as a discrete particle, according to at least one example.
Figure 1C:
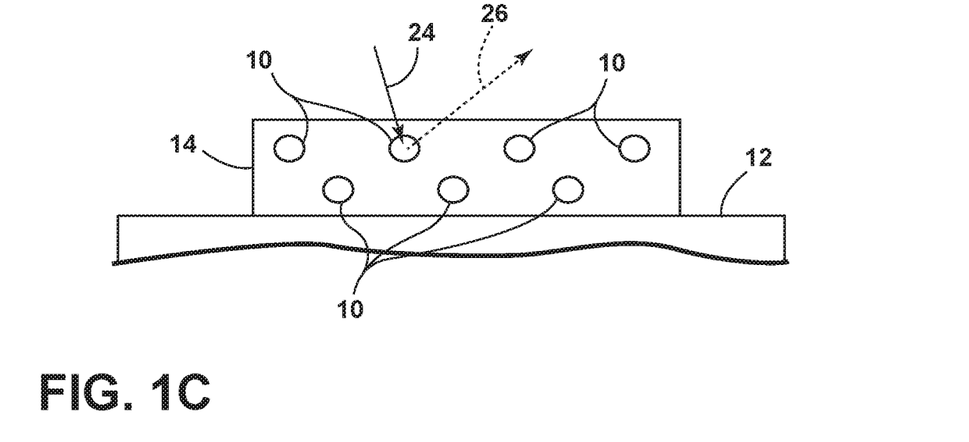
FIG. 1C is a side view of a plurality of photoluminescent structures rendered as discrete particles and incorporated into a separate structure, according to at least one example.

Referring to FIGS. 1A-1C, various exemplary embodiments of photoluminescent structures 10 are shown, each capable of being coupled to a substrate 12, which may correspond to a vehicle fixture or vehicle-related piece of equipment. In FIG. 1A, the photoluminescent structure 10 is generally shown rendered as a coating (e.g., a film) that may be applied to a surface of the substrate 12. In FIG. 1B, the photoluminescent structure 10 is generally shown as a discrete particle capable of being integrated with the substrate 12. In FIG. 1C, the photoluminescent structure 10 is generally shown as a plurality of discrete particles that may be incorporated into a support medium 14 (e.g., a film) that may then be applied (as shown) or integrated with the substrate 12.

At the most basic level, a given photoluminescent structure 10 includes an energy conversion layer 16 that may include one or more sublayers, which are exemplarily shown through broken lines in FIGS. 1A and 1B. Each sublayer of the energy conversion layer 16 may include one or more photoluminescent materials 18 having energy converting elements with phosphorescent, fluorescent and/or energy converting properties. Each photoluminescent material 18 may become excited upon receiving an excitation light 24 of a specific wavelength, thereby causing the light to undergo a conversion process. Under the principle of down conversion, the excitation light 24 is converted into a longer wavelength, converted light 26, that is outputted from the photoluminescent structure 10. Conversely, under the principle of up conversion, the excitation light 24 is converted into a shorter wavelength light that is outputted from the photoluminescent structure 10. When multiple distinct wavelengths of light are outputted from the photoluminescent structure 10 at the same time, the wavelengths of light may mix together and be expressed as a multicolor light.

Light emitted by the sun, ambient sources and/or light sources which excite the photoluminescent material 18 is referred to herein as excitation light 24 and is illustrated herein as solid arrows. In contrast, light emitted from the photoluminescent structure 10 is referred to herein as converted light 26 and is illustrated herein as broken arrows. The mixture of excitation light 24 and converted light 26 that may be emitted simultaneously is referred to herein as outputted light.

The energy conversion layer 16 may be prepared by dispersing the photoluminescent material 18 in a polymer matrix to form a homogenous mixture using a variety of methods. Such methods may include preparing the energy conversion layer 16 from a formulation in a liquid carrier support medium 14 and coating the energy conversion layer 16 to a desired substrate 12. The support medium 14 may include an optically transparent or translucent material such as polymethylmethacrylate, nylon, polycarbonate, polyester, polyvinyl chloride, other visually transparent materials and/or combinations thereof. The energy conversion layer 16 may be applied to the substrate 12 by painting, screen-printing, spraying, slot coating, dip coating, roller coating, bar coating and/or other application methods. Alternatively, the energy conversion layer 16 may be prepared by methods that do not use a liquid carrier support medium 14. For example, the energy conversion layer 16 may be rendered by dispersing the photoluminescent material 18 into a solid-state solution (homogenous mixture in a dry state) that may be incorporated in a polymer matrix, which may be formed by extrusion, injection molding, compression molding, calendaring, thermoforming, etc. The energy conversion layer 16 may then be integrated into the substrate 12 using any methods known to those skilled in the art. When the energy conversion layer 16 includes sublayers, each sublayer may be sequentially coated to form the energy conversion layer 16. Alternatively, the sublayers can be separately prepared and later laminated or embossed together to form the energy conversion layer 16. Alternatively still, the energy conversion layer 16 may be formed by coextruding the sublayers.

In some examples, the converted light 26 that has been down converted or up converted may be used to excite other photoluminescent material(s) 18 found in the energy conversion layer 16. The process of using the converted light 26 outputted from one photoluminescent material 18 to excite another, and so on, is generally known as an energy cascade and may serve as an alternative for achieving various color expressions. With respect to either conversion principle, the difference in wavelength between the excitation light 24 and the converted light 26 is known as the Stokes shift and serves as the principal driving mechanism for an energy conversion process corresponding to a change in wavelength of light. In the various examples discussed herein, each of the photoluminescent structures 10 may operate under either conversion principle.

Referring back to FIGS. 1A and 1B, the photoluminescent structure 10 may optionally include at least one stability layer 20 to protect the photoluminescent material 18 contained within the energy conversion layer 16 from photolytic and thermal degradation. The stability layer 20 may be configured as a separate layer optically coupled and adhered to the energy conversion layer 16. Alternatively, the stability layer 20 may be integrated with the energy conversion layer 16. The photoluminescent structure 10 may also optionally include a protective layer 22 optically coupled and adhered to the stability layer 20 or other layer (e.g., the conversion layer 16 in the absence of the stability layer 20) to protect the photoluminescent structure 10 from physical and chemical damage arising from environmental exposure. The stability layer 20 and/or the protective layer 22 may be combined with the energy conversion layer 16 through sequential coating or printing of each layer, sequential lamination or embossing, or any other suitable means.

Figure 2:
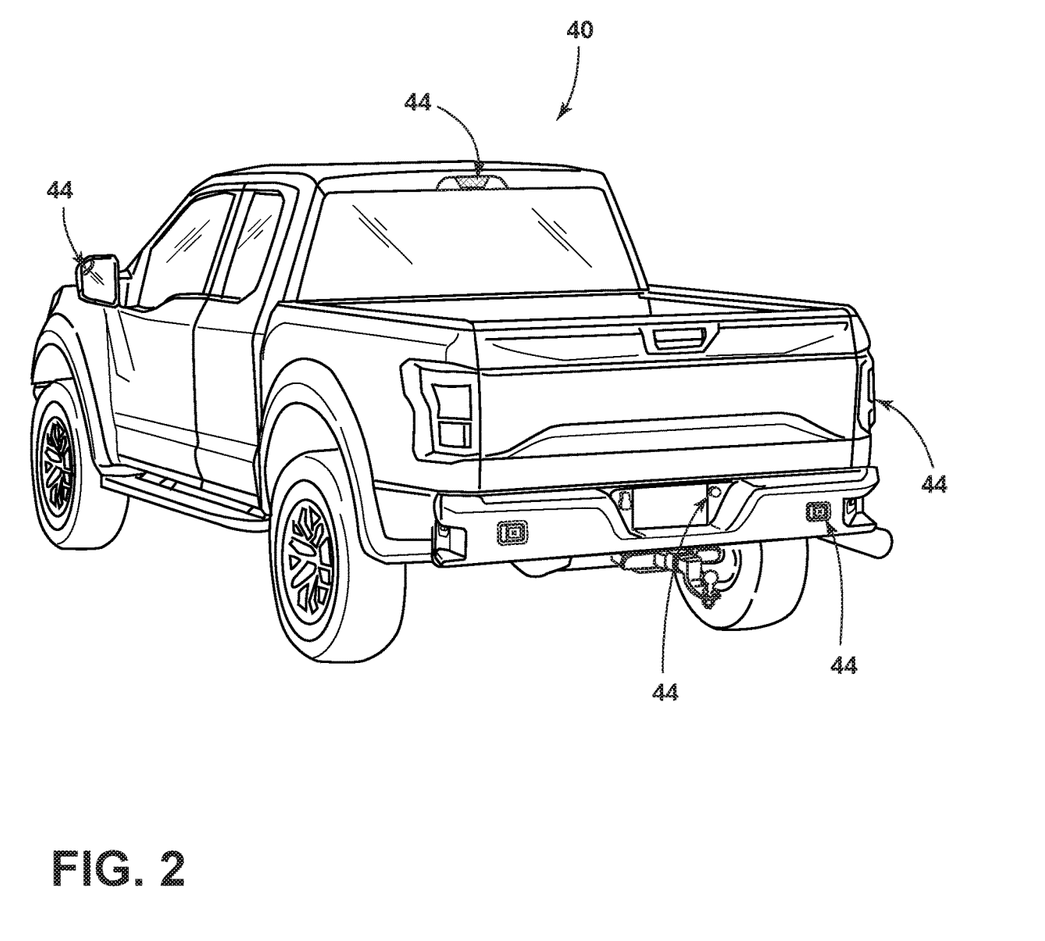
FIG. 2 is a rear perspective view of a vehicle incorporating a vehicle lamp, according to at least one example.
Figure 3:
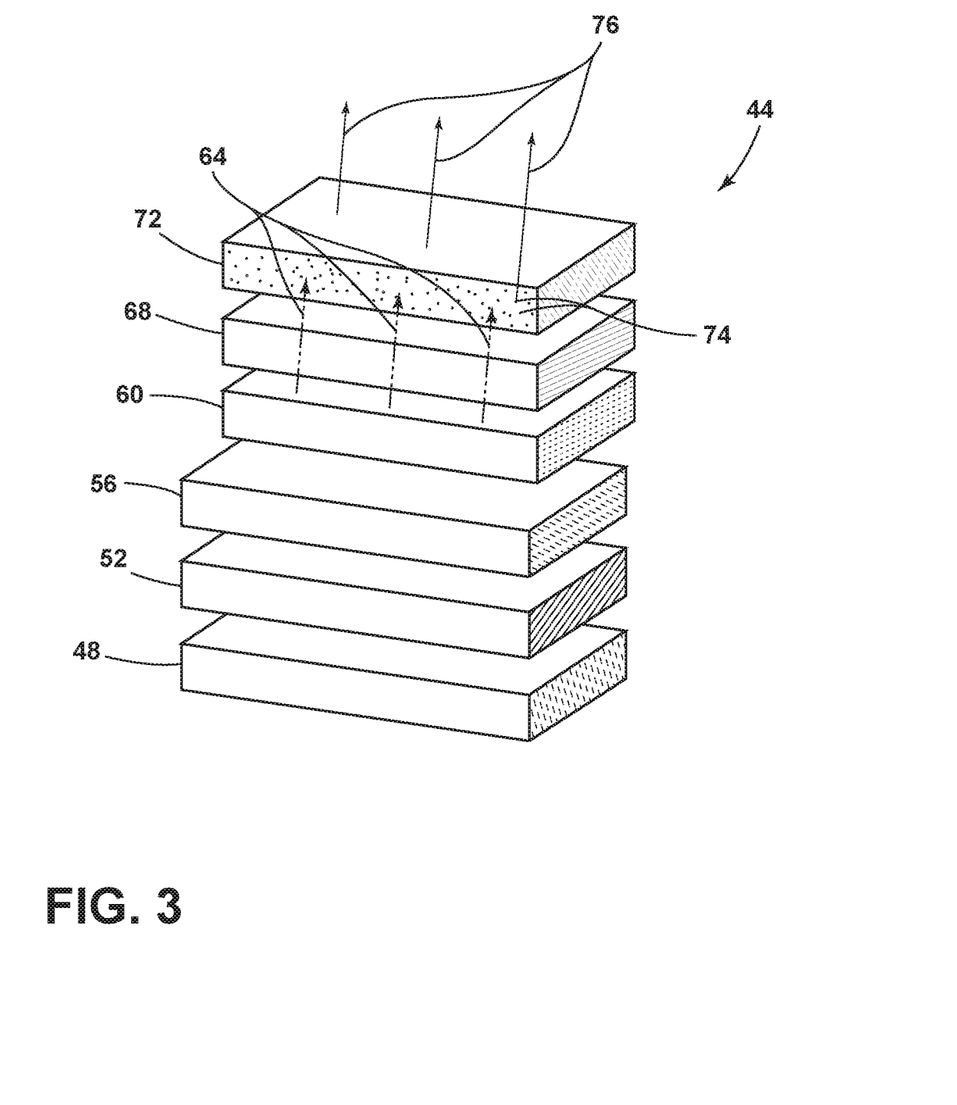
FIG. 3 is an exploded view of a lighting element of the vehicle lamp of FIG. 2.

Referring now to FIGS. 2 and 3, depicted is a vehicle 40 including a lamp 44. The lamp 44 includes a substrate 48 and a first conductor 52 positioned on the substrate 48. According to various examples, the first conductor 52 may be a metallic conductor. A dielectric layer 56 is coupled to the first conductor 52 and disposed over both the substrate 48 and the first conductor 52, such that the first conductor 52 is sandwiched between the substrate 48 and the dielectric layer 56. A semiconductor layer 60 is configured to emit a first light 64. As will be explained in greater detail below, the semiconductor layer 60 may include a plurality of perovskites which emit the first light 64. A second conductor 68 is coupled to the semiconductor layer 60 such that the semiconductor layer 60 is positioned between the dielectric layer 56 and the second conductor 68. More generally, the semiconductor layer 60 is positioned between the first conductor 52 and the second conductor 68. A polymeric layer 72 including a photoluminescent element 74 (e.g., one or both of the photoluminescent material 18 and the photoluminescent structure 10 as outlined above) is coupled to the second conductor 68. The photoluminescent element 74 is configured to emit a second light 76 in response to receiving the first light 64.

Referring now to FIG. 2, the vehicle 40 is depicted as a truck, but it will be understood that the vehicle 40 may be a sedan, van, sport utility vehicle, cross-over or other vehicle 40 without departing from the teachings provided herein. The vehicle 40 may include one or more lamps 44 positioned around the vehicle 40. For example, the lamp 44 may be a tail lamp, a side marker, a headlight, a turn indicator lamp, a center high mount stop light (CHMSL), a license plate lamp, a side mirror lamp, a bumper lamp, other lamp 44 or combinations thereof. The lamps 44 may include one or more housings, covers, shields and/or lenses in order to direct the second light 76 and/or to produce an aesthetically pleasing appearance to the vehicle 40.

Referring now to FIG. 3, the lamp 44 may include the substrate 48 on which other components of the lamp 44 are positioned. The substrate 48 may be composed of polymeric, metallic and/or ceramic materials. According to various examples, the substrate 48 may include one or more dielectric materials (e.g., a silicon chip). In dielectric examples, the substrate 48 may include one or more oxides. For example, the substrate 48 may be composed of any of the materials outlined in connection with the dielectric layer 56. The substrate 48 may be a monolithic block or may be a film or other thin sheet on which other components of the lamp 44 are printed or otherwise disposed.

The first conductor 52 is positioned on the substrate 48. The first conductor 52 may be printed, deposited, adhered or otherwise applied to the substrate 48. The first conductor 52 may be a metal, a transparent conductive oxide, a conductive ink, another conductive material and/or combinations thereof. In metallic examples, the first conductor 52 may include silver, gold, copper, platinum, other conductive metals and/or combinations thereof. In transparent conductive oxide examples, the first conductor 52 may include indium tin oxide, aluminum doped zinc oxide, barium stannate, indium zinc oxide, other transparent conductive oxides and/or combinations thereof. According to various examples, the first conductor 52 may include a metal mesh (e.g., silver nanowires) in a random or ordered orientation.

The dielectric layer 56 is positioned on the first conductor 52 such that the dielectric layer 56 is sandwiched between the first conductor 52 and the semiconductor layer 60. The dielectric layer 56 may include silicon monoxide, silicon dioxide, silicon nitride, alkali halides (e.g., rubidium bromide, lithium fluoride, etc.), barium titanate, other dielectrics and/or combinations thereof. The dielectric layer 56 may be a monolithic block or may be a film or other thin sheet. The dielectric layer 56 may be printed, deposited, adhered or otherwise applied to the first conductor 52 and/or the semiconductor layer 60.

The second conductor 68 is positioned on the semiconductor layer 60. The second conductor 68 may be printed, deposited, adhered or otherwise applied to the semiconductor layer 60 and/or polymeric layer 72. The second conductor 68 may be a metal, a transparent conductive oxide, a conductive ink, another conductive material and/or combinations thereof. In metallic examples, the second conductor 68 may include silver, gold, copper, platinum, other conductive metals and/or combinations thereof. In transparent conductive oxide examples, the second conductor 68 may include indium tin oxide, aluminum doped zinc oxide, barium stannate, indium zinc oxide, other transparent conductive oxides and/or combinations thereof. According to various examples, the second conductor 68 may include a metal mesh (e.g., silver nanowires) in a random or ordered orientation. In some examples, the first and second conductors 52, 68 may include the same material and in other examples the first and second conductors 52, 68 may include different materials.

The semiconductor layer 60 is positioned between the first and second conductors 52, 68. According to various examples, the semiconductor layer 60 may include quantum dots or perovskites. For the purposes of this disclosure, a perovskite is any material with the same type of crystal structure as calcium titanium oxide ($CaTiO_3$) or $^{XII}A^{2+VI}B^{4+}X^{2-}{}_3$ with an oxygen atom in the face centers of the crystal. The general chemical formula for perovskite compounds is $ABX_3$, where A and B are two cations of very different sizes, and X is an anion that bonds to both. According to various examples, the A atoms are larger than the B atoms. According to various examples, a preferred cubic-symmetry structure has the B cation in 6-fold coordination, surrounded by an octahedron of anions, and the A cation in 12-fold cuboctahedral coordination.

According to various examples, the perovskite examples of the semiconductor layer 60 are configured to emit the first light 64 in response to receiving electrical energy (i.e., in the form of current or voltage) from the first and second conductors 52, 60. In other words, the semiconductor layer 60 is configured to emit light in response to an electrical potential being generated between the first and second conductors 52, 60. It will be understood that the perovskites of the semiconductor layer 60 may emit the first light 64 in response to other forms of energy received without departing from the teachings provided herein. The perovskites may tightly confine either electrons or electron holes in all three spatial dimensions and may be photoluminescent. Perovskites may have a radius, or a distance half of their longest length, in the range of between about 1 nm and about 10 nm, or between about 2 nm and about 6 nm. Larger perovskites (e.g., radius of from about 5 nm to about 6 nm) may emit longer wavelength light resulting in the color of the light being such colors as orange or red. Smaller perovskites (e.g., radius of from about 2 nm to about 3 nm) may emit shorter wavelengths resulting in colors such as blue and green. Exemplary compositions of the perovskites may include $LaF_3$ nanocrystals that are doped (e.g., coated) with Yb—Er, Yb—Ho and/or Yb—Tm. In yet other examples, the perovskites may be CsPb crystals including Cl, Br, I and may generally have the formula $CsPb(Cl/Br)_2$, $CsPbBr_3$, $CsPb(I/Br)_3$ and/or $CsPbI_3$. It will be understood that other types of perovskites may be utilized. In yet other examples, the perovskites may include In, Sn, Cd, I, InP/ZnS and/or CuInS/ZnS. According to various examples, the plurality of perovskites of the semiconductor layer 60 includes indium.

The first light 64 emitted by the perovskites of the semiconductor layer 60 may be in the ultraviolet (e.g., about 10 nm to about 400 nm), visible (e.g., about 400 nm to about 700 nm) and/or infrared (e.g., about 700 nm to about 1 mm) wavelength. According to various examples, the perovskites may be configured to emit visible light (e.g., the first light 64) having a wavelength of from about 400 nm to about 700 nm. For example, the perovskites may emit light having a wavelength of from about 380 nm to about 450 nm generally corresponding to violet light, from about 450 nm to about 495 nm generally corresponding to blue light, from about 495 nm to about 570 nm generally corresponding to green light, from about 570 nm to about 590 nm generally corresponding to yellow light, from about 590 nm to about 620 nm generally corresponding to orange light and/or from about 620 nm to about 750 nm generally corresponding to red light. As such, the plurality of perovskites may be configured to emit the first light 64 of a wavelength range of from about 495 nm to about 570 nm in response to an electrical potential being generated between the first and second conductors 52, 68.

The first light 64 from the perovskites may generally have thin, or narrow emission line width. For purposes of this disclosure, an emission line width may be the wavelength range over which the perovskite emits the first light 64. For example, the perovskites may have an emission line width of about 100 nm or less, about 95 nm or less, about 90 nm or less, about 85 nm or less, about 80 nm or less, about 75 nm or less, about 70 nm or less, about 65 nm or less, about 60 nm or less, about 55 nm or less, about 50 nm or less, about 45 nm or less, about 40 nm or less, about 35 nm or less, about 30 nm or less, about 25 nm or less, about 20 nm or less, about 15 nm or less, about 10 nm or less, about 5 nm or less or any and all values and ranges there between.

The perovskites may be introduced into the semiconductor layer 60 in a variety of manners. In a first method, the perovskites may be blended directly into a binder. Next, the mixture of the perovskites and binder may be extruded into the semiconductor layer 60 and positioned on the lamp 44. Another exemplary method of coupling the perovskites and the semiconductor layer 60 is to apply a thin coating of the perovskites to a surface of the semiconductor layer 60. To do this, the perovskites are first blended into a polymer or a polymerizable mixture of monomers. Next, the mixture is then spin coated, ink jetted, screen printed and/or otherwise applied as a thin layer over a surface of the semiconductor layer 60. Monomer mixtures can be polymerized (cured) on the surface after application. Using this approach, it may be important to assure that the polymer or monomer mixture is lipophilic (non-polar) if organic soluble perovskites are being used. Conversely, if water-soluble perovskites are being used, the polymer or monomers may be hydrophilic (water soluble). It will be understood that various inks, dyes, pigments or colorants may be added to the perovskites. Further, the perovskites may be applied as an aqueous, liquid, paste and/or powder form to the dielectric layer 56 and/or the second conductor 68.

The polymeric layer 72 is positioned on the second conductor 68. The polymeric layer 72 may include an optically transparent or translucent material such as polymethylmethacrylate, nylon, polyether ether ketone, polycarbonate, polyester, polyvinyl chloride, other visually transparent materials and/or combinations thereof. The polymeric layer 72 may be coupled to, include, be infused with, or otherwise be coupled with the photoluminescent element 74. In other words, the photoluminescent element 74 is coupled to the second conductor 68. For example, the photoluminescent element 74 may be mixed into or otherwise dispersed into the polymeric layer 72. Additionally or alternatively, the photoluminescent element 74 may be deposited as a coating or thin film on a surface of, or within the polymeric layer 72. The photoluminescent element 74 of the polymeric layer 72 may include one or more rylene family of dyes (e.g., boron-dipyrromethene), other photoluminescent compounds and/or combinations thereof it will be understood that the photoluminescent element 74 may uniformly extend across the polymeric layer 72 or in a discontinuous manner. Further, the photoluminescent element 74 may form on more indicia (e.g., alphanumeric text, symbols, pictures, images, etc.).

The photoluminescent element 74 of the polymeric layer 72 is configured to receive the first light 64 and emit the second light 76 in response. According to various examples, the wavelength of the first light 64 is shorter than the wavelength of the second light 76. Put another way, the wavelength of the second light 76 is longer than the wavelength of the first light 64. According to various examples, the photoluminescent element 74 may be configured to emit visible light having a wavelength of from about 400 nm to about 750 nm. For example, the photoluminescent element 74 may emit light having a wavelength of from about 380 nm to about 450 nm generally corresponding to violet light, from about 450 nm to about 495 nm generally corresponding to blue light, from about 495 nm to about 570 nm generally corresponding to green light, from about 570 nm to about 590 nm generally corresponding to yellow light, from about 610 nm to about 620 nm generally corresponding to orange light and/or from about 620 nm to about 750 nm generally corresponding to red light. As such, the photoluminescent element 74 may be configured to emit the second light 76 of a wavelength range of from about 600 nm to about 750 nm in response to receiving the first light 64.

The polymeric layer 72, including the photoluminescent element 74, may be substantially transparent to visible light. For example, the polymeric layer 72 including the perovskites may have a transmittance at a wavelength of about 530 nm of about 40% or greater, about 45% or greater, about 50% or greater, about 55% or greater, about 60% or greater, about 65% or greater, about 70% or greater, about 75% or greater, about 80% or greater, about 85% or greater, about 90% or greater, about 95% or greater, about 96% or greater, about 97% or greater, about 98% or greater, about 99% or greater or any and all values and ranges therebetween.

In operation, the photoluminescent element 74 of the polymeric layer 72 may be utilized to shift the color of light emitted from the lamp 44 to a different color of light than that produced by the semiconductor layer 60 as the first light 64. For example, the perovskites of the semiconductor layer 60 may be configured to emit the first light 64 in a wavelength range of from about 495 nm to about 570 nm. The first light 64 is transmitted through the second conductor 68 and into the polymeric layer 72. The photoluminescent element 74 of the polymeric layer 72 is configured to absorb the first light 64 and Stokes shift (i.e., Stokes shifts can be performed by a molecule that can absorb a photon of shorter wavelength (higher frequency or energy) and emit a longer-wavelength photon) the wavelength of the first light 64 into a longer wavelength of the second light 76 emitted by the photoluminescent element 74. For example, the photoluminescent element 74 may emit the second light 76 at a wavelength range of from about 600 nm to about 750 nm, or from about 610 nm to about 620 nm. Such a feature of Stokes shifting between the first light 64 and the second light 76 is advantageous in that the human eye is more sensitive to shades of red that have shorter wavelengths than those of longer wavelengths. Further, the red and/or orange shades of the second light 76 (e.g., from about 610 nm to about 620 nm wavelength) meet legal requirements for tail lamps.

Use of the present disclosure may offer a variety of advantages. For example, use of the presently disclosed lamp 44 may achieve greater than 50% transparency of the polymeric layer 72 in addition to an efficiency of at least 10% (i.e., in Stokes shifting of the first light 64 to the second light 76) which yields about 30 cd/m$^2$ light output which is adequate for automotive lighting applications. Further, lamps 44 of the present disclosure may be thinner than conventional light sources and offer visual styling effects similar to conventional organic light emitting diode light sources.

According to various embodiments, a vehicle lamp, includes: a substrate; a first conductor positioned on the substrate; a dielectric layer coupled to the first conductor; a semiconductor layer configured to emit a first light; a second conductor coupled to the semiconductor layer; and a polymeric layer comprising a photoluminescent element coupled to the second conductor, wherein the photoluminescent element is configured to emit a second light in response to receiving the first light. Embodiments of the vehicle lamp can include any one or a combination of the following features:

- the first light comprises light of a wavelength range of from about 495 nm to about 570 nm;
- the second light comprises light of a wavelength of a range of from about 600 nm to about 750 nm;
- the second light comprises light of a wavelength of a range of from about 610 nm to about 620 nm;
- the first conductor comprises a metal;
- the second conductor comprises a transparent conductive oxide;
- the semiconductor layer is configured to emit light in response to an electrical potential being generated between the first and second conductors;
- the polymeric layer comprises polyether ether ketone;
- the photoluminescent element comprises boron-dipyrromethene;
- the semiconducting, layer comprises a plurality of perovskites;
- the plurality of perovskites comprise at least one of indium, tin, cadmium and iodine;
- the plurality of perovskites comprise indium;
- the vehicle lighting element is a tail lamp; and/or
- the second light comprises light having a longer wavelength than the first light.

What is claimed is:

1. A vehicle lamp, comprising:
a substrate;
a first conductor positioned on the substrate;
a dielectric layer coupled to the first conductor and disposed over both the substrate and the first conductor with the first conductor being disposed between the substrate and the dielectric layer;
a semiconductor layer configured to emit a first light;
a second conductor coupled to the semiconductor layer; and
a polymeric layer comprising a photoluminescent element coupled to the second conductor, wherein the photoluminescent element is configured to emit a second light in response to receiving the first light.

2. The vehicle lamp of claim 1, wherein the first light comprises light of a wavelength range of from about 495 nm to about 570 nm.

3. The vehicle lamp of claim 1, wherein the second light comprises light of a wavelength of a range of from about 600 nm to about 750 nm.

4. The vehicle lamp of claim 3, wherein the second light comprises light of a wavelength of a range of from about 610 nm to about 620 nm.

5. The vehicle lamp of claim 1, wherein the first conductor comprises a metal.

6. The vehicle lamp of claim 1, wherein the second conductor comprises a transparent conductive oxide.

7. The vehicle lamp of claim 1, wherein the semiconductor layer is configured to emit light in response to an electrical potential being generated between the first conductor and the second conductor.

8. The vehicle lamp of claim 1, wherein the polymeric layer comprises polyether ether ketone.

9. The vehicle lamp of claim 1, wherein photoluminescent element comprises boron-dipyrromethene.

10. The vehicle lamp of claim 1, wherein the semiconductor layer comprises a plurality of perovskites.

11. The vehicle lamp of claim 10, wherein the plurality of perovskites comprise at least one of indium, tin, cadmium and iodine.

12. The vehicle lamp of claim 11, wherein the plurality of perovskites comprise indium.

13. The vehicle lamp of claim 1, wherein the vehicle lamp is a tail lamp.

14. A vehicle tail lamp, comprising:
a first metallic conductor positioned on a substrate;
a semiconductor layer coupled to the first metallic conductor and comprising a plurality of perovskites configured to emit a first light;
a second conductor coupled to the semiconductor layer, wherein the second conductor comprises a substantially transparent material, the semiconductor layer emitting the first light in response to receiving electrical energy from the first metallic conductor and the second conductor; and
a photoluminescent element coupled to the second conductor and configured to emit a second light in response to receiving the first light.

15. The vehicle tail lamp of claim 14, wherein the first metallic conductor comprises silver.

16. The vehicle tail lamp of claim 14, wherein the second light comprises light having a longer wavelength than the first light.

17. A vehicle lamp, comprising:
a semiconductor layer comprising a plurality of perovskites coupled between a first conductor and a second conductor, the plurality of perovskites configured to emit a first light of a wavelength range of from about 495 nm to about 570 nm in response to an electrical potential being generated between the first conductor and the second conductor; and
a photoluminescent element positioned to receive the first light and emit a second light of a wavelength of a range of from about 600 nm to about 750 nm in response to receiving the first light.

18. The vehicle lamp of claim 17, wherein the plurality of perovskites comprise at least one of indium, tin, cadmium and iodine.

19. The vehicle lamp of claim 18, wherein the photoluminescent element comprises boron-dipyrromethene.

20. The vehicle lamp of claim 19, wherein the second light comprises light of a wavelength of a range of from about 610 nm to about 620 nm.

\* \* \* \* \*